(12) United States Patent
Lee et al.

(10) Patent No.: US 9,105,505 B2
(45) Date of Patent: Aug. 11, 2015

(54) MEMORY CELL HAVING A RECESSED GATE AND MANUFACTURING METHOD THEREOF

(71) Applicant: INOTERA MEMORIES, INC., Taoyuan (TW)

(72) Inventors: Chien-Chi Lee, Taipei (TW); Chia-Ming Yang, Kaohsiung (TW); Wei-Ping Lee, Taoyuan County (TW); Hsin-Huei Chen, Miaoli County (TW); Chih-Yuan Hsiao, New Taipei (TW); Ping Kao, Taipei (TW); Kai-Lun Chiang, Taoyuan County (TW); Chao-Sung Lai, Taoyuan County (KR); Jer-Chyi Wang, Taoyuan County (TW)

(73) Assignee: INOTERA MEMORIES, INC., Hwa-Ya Technology Park Kueishan, Taoyuan (TW)

( * ) Notice: Subject to any disclaimer, the term of this patent is extended or adjusted under 35 U.S.C. 154(b) by 98 days.

(21) Appl. No.: 14/025,805

(22) Filed: Sep. 12, 2013

(65) Prior Publication Data

US 2014/0312401 A1     Oct. 23, 2014

(30) Foreign Application Priority Data

Apr. 17, 2013   (TW) .............................. 102113655 A

(51) Int. Cl.
*H01L 27/10*    (2006.01)
*H01L 27/108*   (2006.01)

(52) U.S. Cl.
CPC .... *H01L 27/10823* (2013.01); *H01L 27/10876* (2013.01)

(58) Field of Classification Search
CPC .................. H01L 21/28194; H01L 21/28185; H01L 27/10852; H01L 27/10894; H01L 27/105; H01L 27/10814; H01L 27/10888; H01L 29/513; H01L 29/517; H01L 29/518; H01L 28/40; H01L 28/55; H01L 28/60; H01L 28/91
USPC ................................... 257/296, 410; 438/235
See application file for complete search history.

(56) References Cited

U.S. PATENT DOCUMENTS

| 6,144,057 | A   | 11/2000 | Yamazaki |           |
|-----------|-----|---------|----------|-----------|
| 7,893,482 | B2  | 2/2011  | Kim      |           |
| 2006/0091482 | A1 | 5/2006 | Kim     |           |
| 2007/0007571 | A1 | 1/2007 | Lindsay |           |
| 2011/0089513 | A1 | 4/2011 | Endo    |           |
| 2011/0175162 | A1* | 7/2011 | Kim     | 257/330  |
| 2012/0086084 | A1* | 4/2012 | Kikuchi | 257/369  |

* cited by examiner

*Primary Examiner* — Monica D Harrison
(74) *Attorney, Agent, or Firm* — Winston Hsu; Scott Margo

(57) ABSTRACT

A memory cell with a recessed gate includes a semiconductor substrate, a shallow trench isolation, an active region, a gate electrode, a halogen-doped dielectric layer and at least a capacitor. The shallow trench isolation is disposed in the semiconductor substrate in order to define the active region. A source region and a drain region are respectively disposed on each end of the active region along a first direction. A gate trench is formed in the semiconductor substrate between the source region and the drain region, wherein the gate trench includes a sidewall portion and a curved-bottom surface. The curved-bottom surface has a convex profile when viewed from a cross-sectional view taken along a second direction perpendicular to the first direction. The gate electrode is disposed in the gate trench and the halogen-doped dielectric layer is disposed between the gate electrode and the semiconductor substrate.

19 Claims, 10 Drawing Sheets

MEMORY CELL HAVING A RECESSED GATE AND MANUFACTURING METHOD THEREOF

BACKGROUND OF THE INVENTION

1. Field of the Invention

The present invention generally relates to the field of memory devices with recesses gate structures, and more particularly to a memory cell with a halogen-doped dielectric layer and a fabrication method thereof.

2. Description of the Prior Art

For years the trend in the memory industry as well as the semiconductor industry has been to scale down the size of memory cells in order to increase the integration level and thus the memory capacity of DRAM chips. In a DRAM cell with a recessed gate, the current leakage caused by a capacitor is often reduced or avoided thanks to a relatively long channel length beneath the recessed gate. Therefore, more and more DRAM cells are equipped with recessed gates rather than with a conventional planar gate structure due to their superior performances.

In general, the DRAM cells with a recessed gate include a transistor device and a charge storage device. More precisely, the transistor device includes a pair of source/drain regions, a recessed gate and a carrier channel inside a semiconductor substrate. The charge storage device is often a capacitor used to store charges. During the operation of the DRAM cell, a bias voltage is applied to the gate electrode inside the recessed gate, which enables charges to flow along the carrier channel between the source/drain regions. The charges flow in and are stored in the corresponding capacitor. However, due to limitations in fabrication technologies, many defects are formed in the gate dielectric layer on the bottom of the recessed gate. More precisely, these defects are caused by dangling bonds being located on the surface of the oxide layer and/or at oxide layer/semiconductor substrate interface. Under these conditions, several current paths are created by these defects, leading charges to be released from the capacitor unusually, which is obviously bad for the data retention time of the DRAM device.

Therefore, there is still a need to provide an improved memory cell with a recessed gate and a fabrication method thereof that reduces the defects caused by dangling bonds and enhances the performance and reliability of the corresponding memory device.

SUMMARY OF THE INVENTION

One object of the present invention is to provide a memory cell with a recessed gate and a fabrication method thereof so as to overcome the above-mentioned drawbacks.

To this end, according to one preferred embodiment of the present invention, a memory cell with a recessed gate is provided. The memory cell includes a semiconductor substrate, a shallow trench isolation, an active region, a gate electrode, a halogen-doped dielectric layer and at least a capacitor. The shallow trench isolation is disposed in the semiconductor substrate in order to define the active region. A source region and a drain region are respectively disposed on each side of the active region, wherein a direction from the source region to the drain region is defined as a first direction. A gate trench is formed in the semiconductor substrate between the source region and the drain region, wherein the gate trench includes a sidewall portion and a curved-bottom surface. The curved-bottom surface has a convex profile when viewed from a cross-sectional view taken along a second direction perpendicular to the first direction. The gate electrode is disposed in the gate trench and the halogen-doped dielectric layer is disposed between the gate electrode and the semiconductor substrate. Besides, the capacitor is electrically connected to the source region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
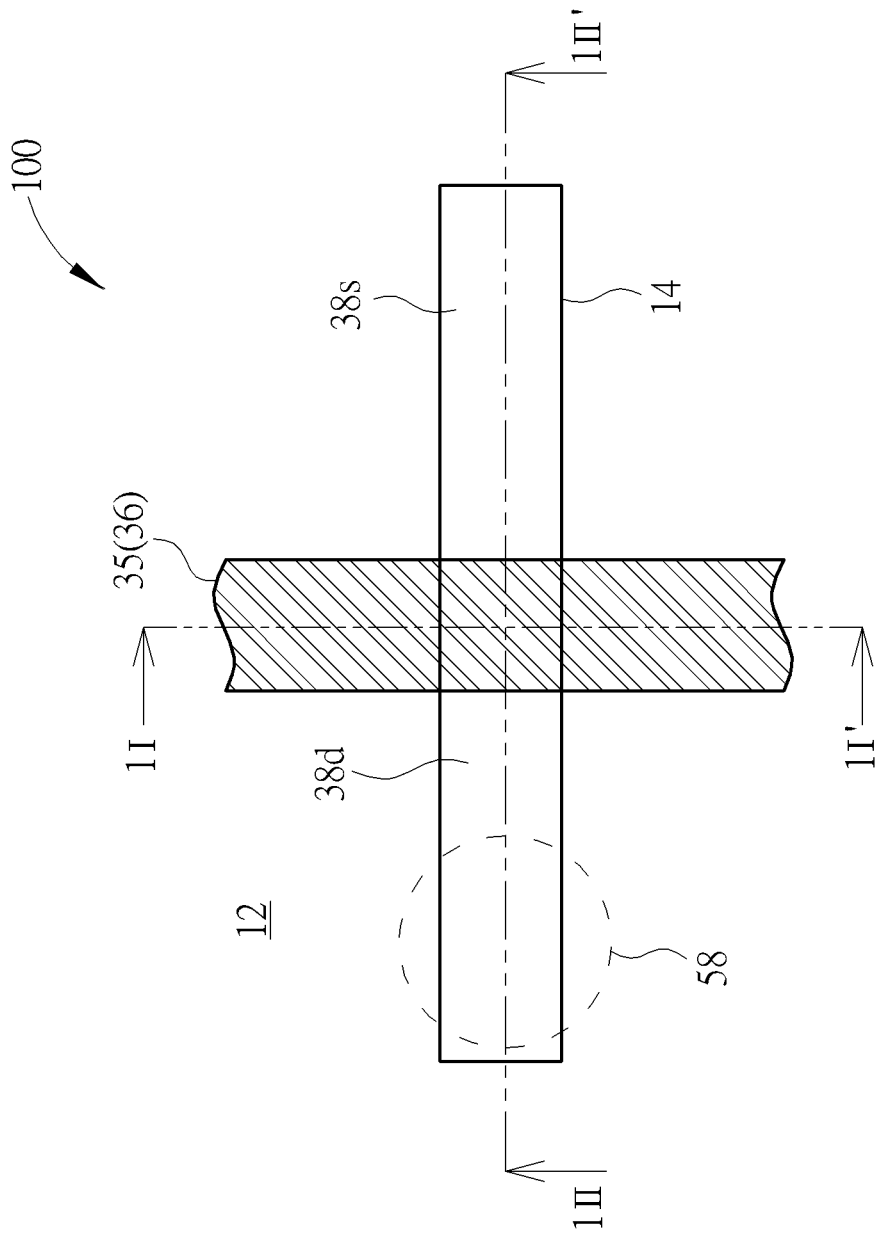
FIG. 1 is a schematic top view diagram showing a memory cell with a recessed gate according to a first embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art. Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

In addition, in all of the specification, a term "includes" shall be construed as "comprises but not limited thereto"; a term "be adjacent to" shall be interpreted as "be substantially in contact with"; a term "horizontal" is defined as a plane parallel to the conventional major plane or a surface of the semiconductor substrate, regardless of its orientation; a term "vertical" refers to a direction perpendicular to the horizontal plan just defined. Terms, such as "on", "above", "below", "bottom", "top", "side", "higher", "lower", "over" and "under", are defined relatively to the horizontal plane.

Figure 2:
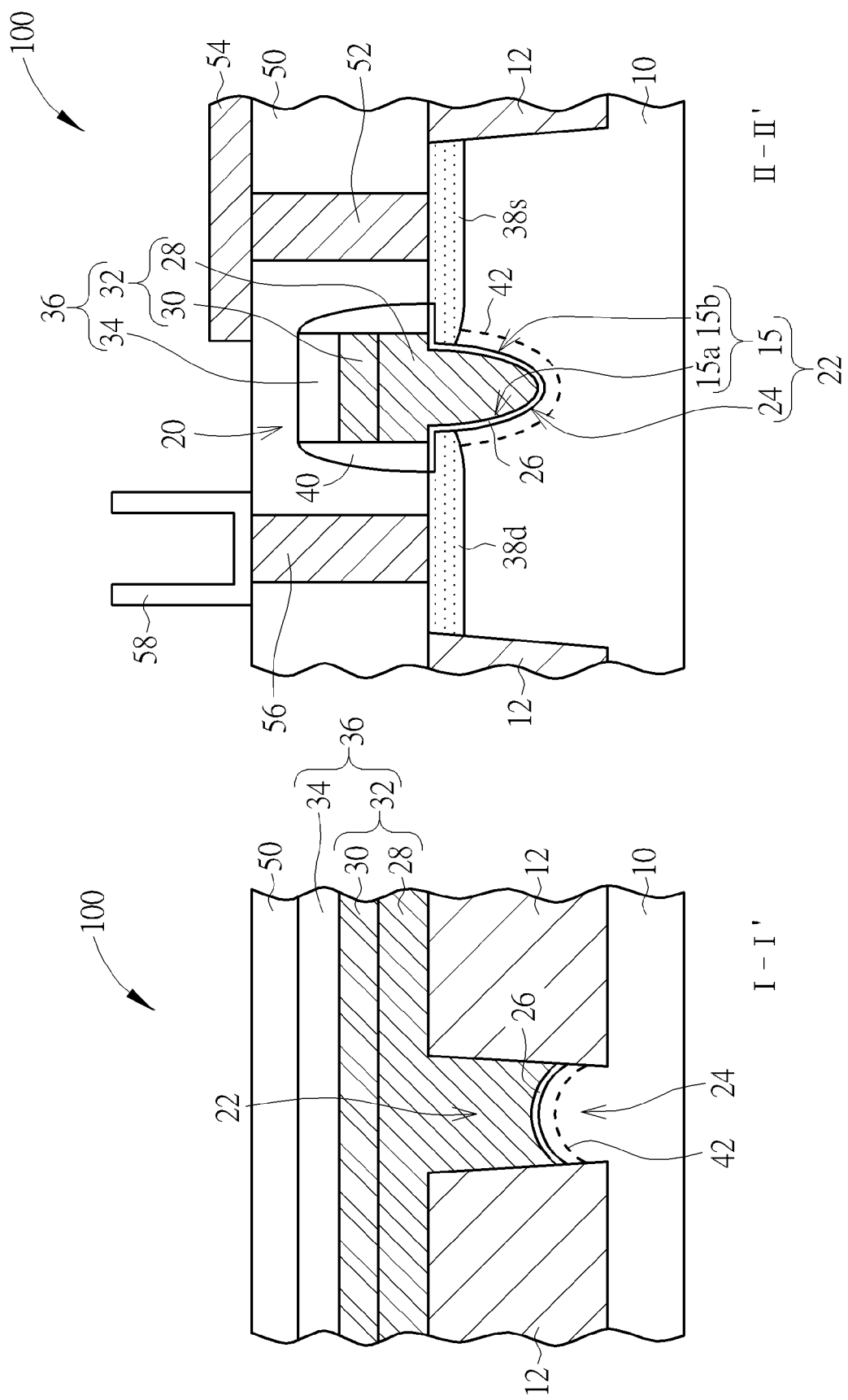
FIG. 2 is a schematic diagram showing a memory cell with a recessed gate according to the first embodiment of the present invention.

In the following paragraph, the above-described DRAMs, i.e. a DRAM with a recessed gate, will be described in detail. FIG. 1 is a schematic top view diagram showing a memory cell with a recessed gate according to a first embodiment of the present invention. FIG. 2 is a schematic diagram showing a memory cell taken respectively along line 1I-I' and line 1II-II' in FIG. 1. More precisely, a cross-sectional diagram on the left-hand side of FIG. 2 is taken along a channel width direction while a cross-sectional diagram on the right-hand side of FIG. 2 is taken along a channel length direction. According to this embodiment, the channel width direction is orthogonal to the channel length direction.

Please refer to FIG. 1 and FIG. 2. FIG. 1 and FIG. 2 are schematic diagrams showing a memory cell with a recessed gate according to a first preferred embodiment of the present invention. A memory cell, such as a dynamic random access memory (DRAM) cell 100 with a recessed gate, is depicted in FIG. 1 and FIG. 2. The DRAM cell 100 at least includes a transistor device 20 and a capacitor 58, which is used to serve as the smallest unit in the DRAM array. The DRAM cell in a DRAM array 100 is able to accept signals from a bit line (not shown) and a word line 35 during the operation. The DRAM cell 100 further includes a shallow trench isolation (STI) 12 and an active region 14. More precisely, the STI 12 is disposed in the semiconductor substrate 10 so as to define the active region 14 capable of accommodating a transistor device 20. For example, a top view appearance of the active region 14 may be rectangular, but not limited thereto. It should be noted that the DRAM cell 100 is not restricted to only include one transistor device and one capacitor near the transistor device, the DRAM cell may also include two transistor devices and two capacitors, such as a DRAM cell with a common source structure, but not limited thereto.

Please refer now to FIG. 2. The transistor device 20 disclosed in the first preferred embodiment at least includes a source region 38s, a drain region 38d, a gate structure 36, and a halogen-doped dielectric layer 26. More precisely, the source region 38s may be electrically connected to the bit line 54 through a source contact plug 52 while the drain region 38d may be electrically connected to the capacitor 58 through a storage node contact plug 56. The gate structure 36 with an embedded bottom is disposed on the semiconductor substrate 10 where a gate trench is formed. Spacers 40 respectively cover the sidewall of the gate structure 36. More precisely, the gate structure 36 at least includes a semiconductor layer 28, a conductive layer 30, and a cap layer 34 from bottom to top. The semiconductor layer 28 and the conductive layer 30 may be regarded as a gate electrode 32. Through applying proper voltage to the gate electrode 32, a carrier channel 42 underneath the gate trench 22 may be turned on or off so as to allow or restrict the flow of current.

Figure 3:
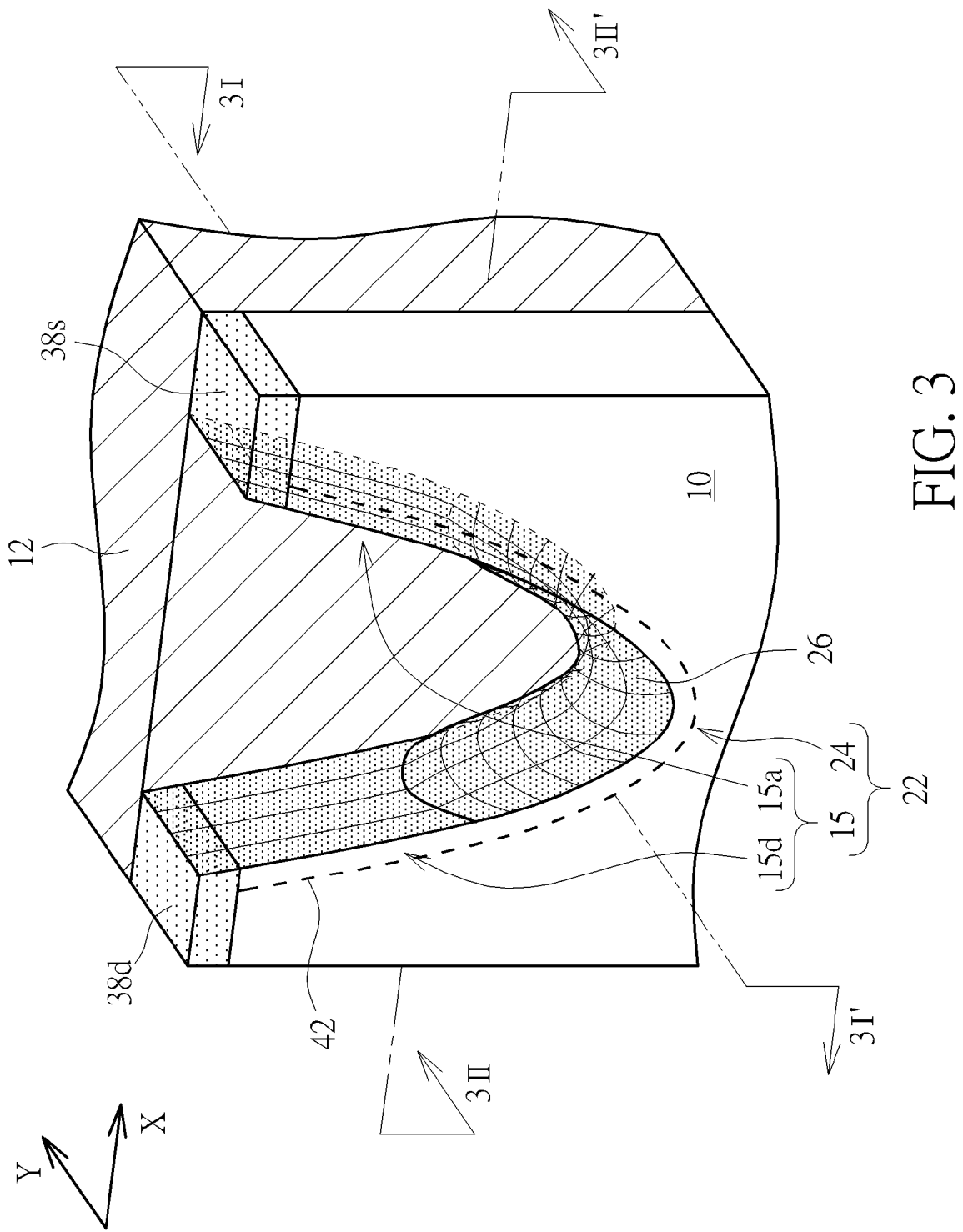
FIG. 3 is a schematic diagram corresponding to FIG. 2 according to the first embodiment of the present invention.

Please refer to FIG. 3. FIG. 3 is a schematic perspective diagram corresponding to FIG. 2 wherein a line 3I-I' and line a line 3II-II' respectively correspond to the line 1I-I' and the line 1II-II' in FIG. 1. As shown in FIG. 2 and FIG. 3, the gate trench 22 disclosed in the first preferred embodiment is disposed in the semiconductor substrate 10 between the source region 38s and the drain region 38d. More precisely, the gate trench 22 includes sidewall portions 15 and a curved-bottom surface 24, wherein the sidewall portions 15 further include a first sidewall 15a adjacent to the source region 38s and a second sidewall 15b adjacent to the drain region 38d. In other words, the first sidewall 15a is opposite to the second sidewall 15b along a first direction X. When taking a cross-section of the gate trench 22 along the first direction X (corresponding to the II-II' cross-section in FIG. 2), the curved-bottom surface 24 of the gate trench 22 substantially shows a U-shaped profile or a positive parabolic profile. In another case, when taking a cross-section of the gate trench 22 along a second direction Y orthogonal to the first direction X (corresponding to I-I' cross-section in FIG. 2), the curved-bottom surface 24 of the gate trench 22 substantially shows a convex profile. In the structure shown in FIG. 2, this convex profile has a first predetermined depth D1 and a second predetermined depth D2 with a height difference H between them. The height difference H has a maximum value at the central region of the gate trench 22 and gradually reduces from the central region towards each sides of the gate trench 22 along the channel length direction (i.e. first direction X). In detail, the feature of gradual reduction in height difference H is due to the three-dimensional (3D) saddle-shaped profile of the curved-bottom surface 24. This feature is depicted in FIG. 3. Compared with conventional U-shaped recessed gate trenches, the gate trench 22 with the saddle-shaped profile can provide wider channel widths, thereby increasing the driving current of the transistor device 20. In addition, since the bottom surface of the gate electrode 32 directly covers the curved-bottom surface 24, a structural feature similar to that of the double gate transistor can be obtained. That is to say, the charges flowing between the source/drain can be controlled by the gate electrode 32 more effectively and electrical properties, such as subthreshold swing (SS), of the transistor device 20 can be therefore improved.

Keep referring to FIG. 2 and FIG. 3; a halogen-doped dielectric layer 26 is disposed between the gate electrode 32 and the semiconductor substrate 10 according to the first preferred embodiment of the present invention. The halogen-doped dielectric layer 26 may be a dielectric layer containing fluorine, chlorine, bromine or other suitable halogen atoms and may serve as a gate dielectric layer. Through applying proper voltage to the gate electrode 32, the carrier channel 42 underneath the gate trench 22 may be turned on and enable charges to flow between source/drain regions 38s and 38d. According to this embodiment, the halogen-doped dielectric layer 26 conformally covers the surface of the gate trench 22. That is to say, the halogen-doped dielectric layer 26 can cover the first sidewall 15a, the second sidewall 15b and the curved-bottom surface 24 of the gate trench 22. Preferably, the halogen-doped dielectric layer 26 is a fluorine-containing dielectric layer and the concentration of fluorine atoms of which is substantially ranging from 1E11 atoms/cm3 to 1E16 atoms/cm3. Compared with conventional non-halogen doped dielectric layers, since halogen atoms in the halogen-doped dielectric layer 26 are prone to bonding with defects, such as defects caused by dangling bonds, inside the halogen-doped dielectric layer 26 or at the interface between the halogen-doped dielectric layer 26 and the semiconductor substrate 10, possible current leakage paths are therefore amended and gate-induced drain leakage (GIDL) occurring in conventional DRAM cells can be avoided. As a result, the data retention time for charges originally stored in the capacitor 58 can be increased and the performance and reliability of the DRAM devices are improved. It should be noted that the dangling bonds may comprise lone pairs of electrons or unpaired electrons located on incompletely bonded semiconductor atoms, such as silicon atoms, but not limited thereto. In another case, if the main composition of the gate dielectric layer is a high-k dielectric, the dangling bonds may comprise lone pairs of electrons or unpaired electrons located on incompletely bonded rare earth atoms.

In the following paragraphs, a method for fabricating the above-mentioned memory cell is described in detail. In addition, like or similar features will usually be described with same reference numerals for the ease of illustration and description thereof.

Figure 4:
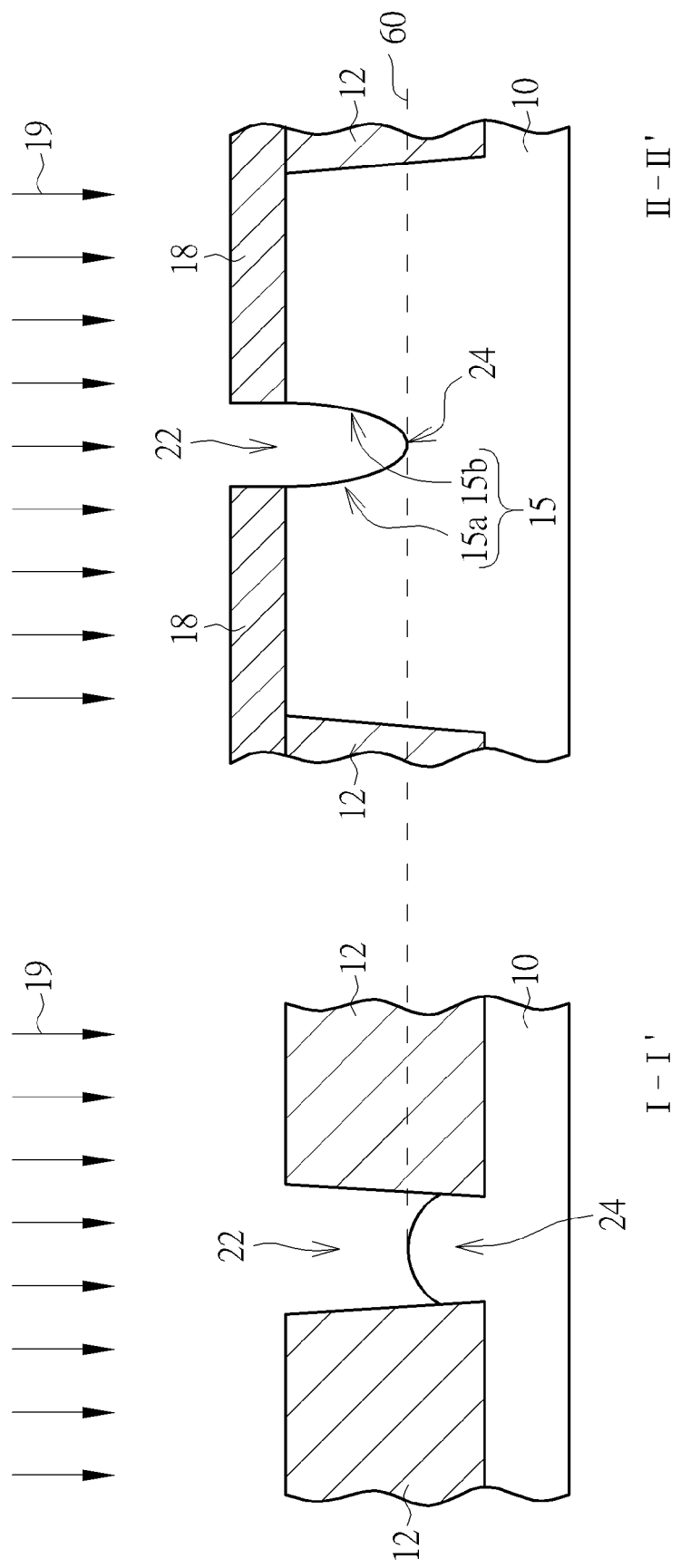
FIG. 4 to FIG. 6 are schematic diagrams showing a method for fabricating a memory cell with a recessed gate according to the first embodiment of the present invention.
Figure 5:
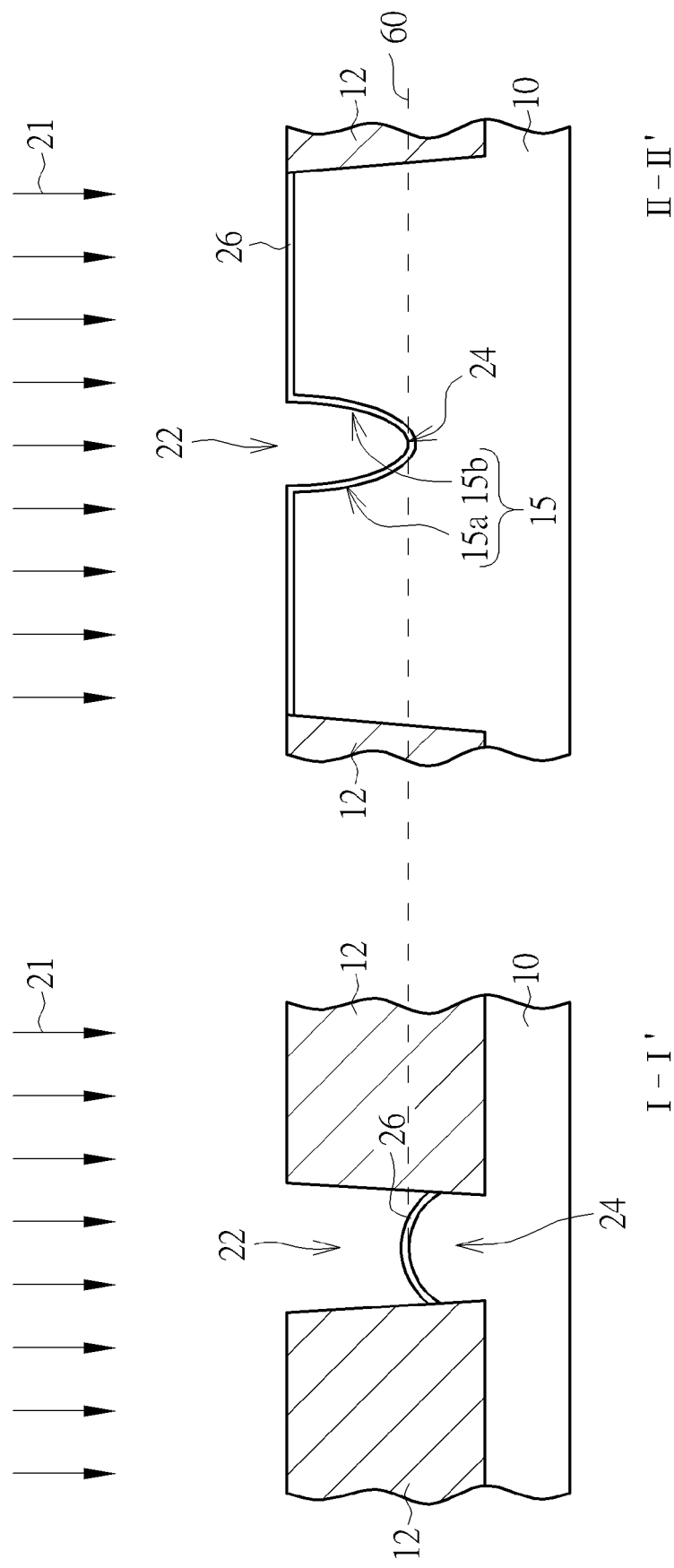
Figure 6:
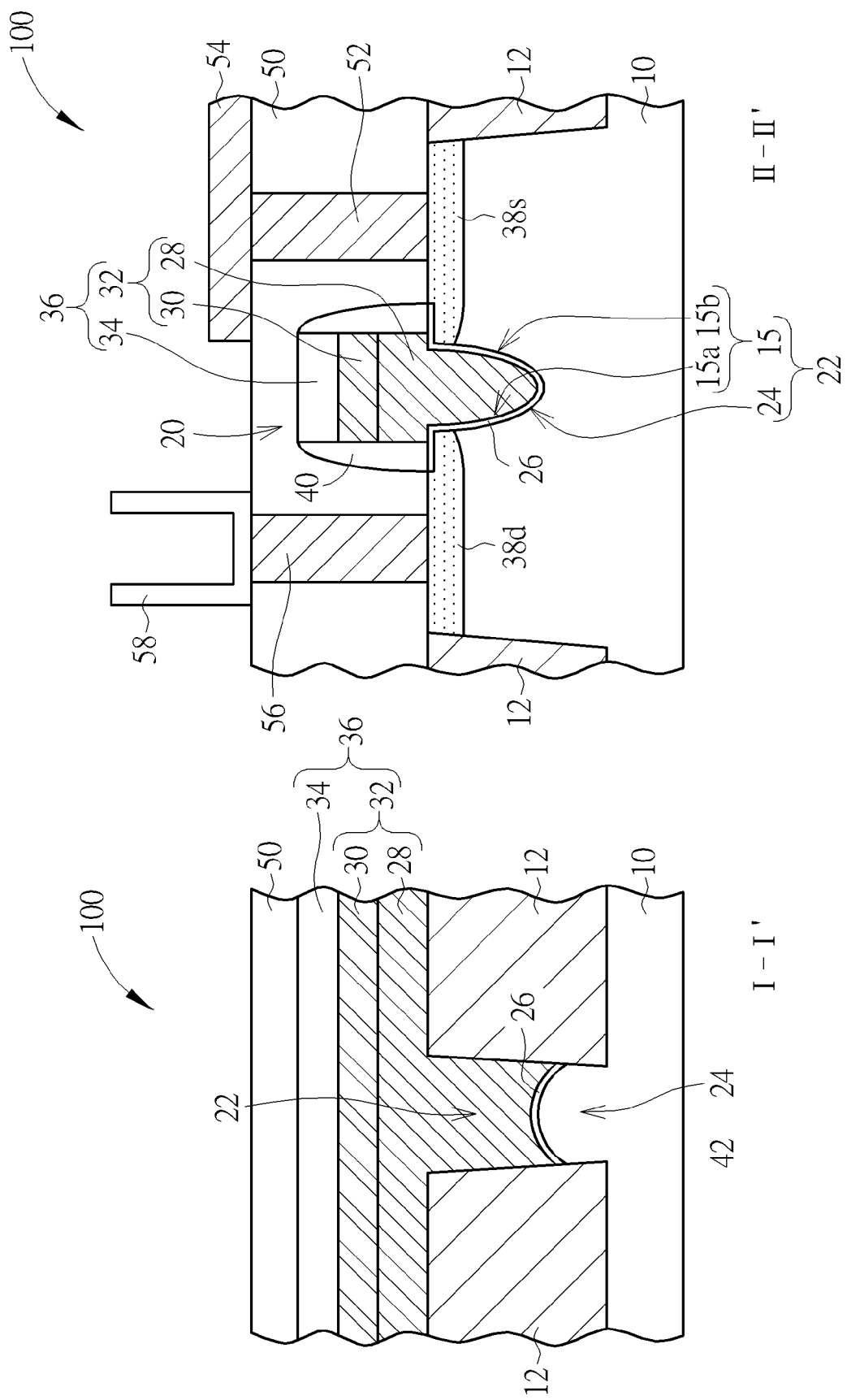

Please refer to FIG. 4 to FIG. 6. FIG. 4 to FIG. 6 are schematic diagrams showing a method for fabricating a memory cell with a recessed gate according to the first embodiment of the present invention. Similarly, the I-I' diagrams in each figure correspond to cross sectional views taken along a line I-I' in FIG. 1, while the II-II' diagrams in each figure correspond to cross sectional views taken along a line II-II' in FIG. 1. At the beginning of the fabrication process, as shown in FIG. 4, a semiconductor substrate 10 having a shallow trench isolation 12 and an active region (not shown) is provided. The semiconductor substrate 10 may be a single crystalline silicon substrate, a silicon-on-insulator (SOI) substrate or a semiconductor substrate covered by epitaxial materials (such as silicon germanium or silicon phosphide). A shallow trench isolation 12 is disposed in the semiconductor substrate 10 used to define an active region. The composition of the shallow trench isolation 12 may include silicon oxide, silicon nitride, silicon oxynitride or other suitable insulation material. In a next step, a patterned etch mask 18 is formed on the semiconductor substrate 10 such that portions of the semiconductor substrate 10 can be exposed. Subsequently, an etching process 19, such as a dry etching process, is carried out to etch the exposed semiconductor substrate 10 until at least a gate trench 22 is formed. As described in the previous paragraphs, the gate trench 22 has sidewall portions 15 and a curved-bottom surface 24. More precisely, the sidewall portions 15 include a first sidewall 15a and a second sidewall 15b oppositely disposed along a first direction X, while the curved-bottom surface 24 substantially has a three-dimensional saddle-shaped profile. In this configuration, the top of the curved-bottom surface 24 in the I-I' diagram of FIG. 4 and the bottom of the curved-bottom surface 24 in the II-II' diagram of FIG. 4 are on the same horizontal level 60. This feature is also shown in FIG. 3.

After the formation of the gate trench 22, the patterned etch mask 18 is then removed. Afterwards, a suitable process, such as a thermal oxidation process, a diffusion process or a deposition process, is carried out to form a gate dielectric layer on the surface of the gate trench 22. The composition of the gate dielectric layer 22 may include silicon oxide, silicon oxynitride or high-k dielectric, but not limited thereto. More precisely, high-k dielectric could be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_3$), zirconium oxide ($ZrO_2$), strontium titanate oxide ($SrTiO_3$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but not limited thereto.

After the formation of the gate dielectric layer inside the gate trench 22, a process shown in FIG. 5 may be carried out. Please refer now to FIG. 5; a halogen implantation process 21, such as a fluorine ion implantation process, may be carried out. During the halogen implantation process 21, halogen atoms may be implanted into the gate dielectric layer and a halogen-doped dielectric layer 26 is therefore formed. For example, the halogen implantation process 21 may be a plasma-assisted ion implantation process such that halogen atoms can be distributed in the halogen-doped dielectric layer 26 uniformly, but not limited thereto. It should be noted that there are various ways to dope halogen atoms into the gate dielectric layer or into the interface between the gate dielectric layer and the semiconductor substrate 10. For example, halogen atoms may also be doped into the gate dielectric layer through a vapor-phase diffusion process, an ion implantation process, or other suitable processes. Since the halogen atoms have a relatively high chemical bonding activity, they are prone to bond with semiconductor atoms or metal atoms with dangling bonds and therefore reduce the amount of defects caused by the dangling bonds. When a fluorine ion implantation process is carried out, an ion implantation energy may be about 15 keV and a dose may be about 1E13~5E14 atoms/$cm^2$ so as to form stable —F—Si— bonds. Preferably, the fluorine ion implantation process may be carried out with an ion implantation energy of about 15 keV and a dose of about 1E13~5E14 atoms/$cm^2$. It should be noted that, through this halogen implantation process 21, halogen atoms may be implanted into both the semiconductor substrate 10 beneath the gate trench 22 and the surface of the semiconductor substrate 10. Afterwards, an optional densification process, such as a thermal treatment, may be further carried out to densify the gate dielectric layer so that the defects inside the gate dielectric layer may be further reduced. It should be noted that the defects caused by dangling bonds can be amended effectively if the halogen implantation process 21 is performed prior to performing the densification process.

Please refer now to FIG. 6; a transistor device 20 and a capacitor 58 are formed on the semiconductor substrate 10 in a final step. More precisely, the transistor device 20 at least includes a source region 38s, a drain region 38d, a gate structure 36, and a halogen-doped dielectric layer 26. The source region 38s may be electrically connected to the bit line 54 through a source contact plug 52 while the drain region 38d may be electrically connected to the capacitor 58 through a storage node contact plug 56. According to the above paragraphs, the halogen-doped dielectric layer 26 is formed on the surface of the gate trench 22 before filling the gate electrode 32 into the gate trench 22. It should be noted that the semiconductor layer 28 may be single crystalline or polycrystalline and may be made of silicon, germanium or other suitable semiconductor material. The conductive layer 30 and the bit line 54 may be made of conductive materials with low resistance, such as metal materials chosen from aluminum, copper, tungsten or alloys thereof, but not limited thereto. The spacer 40 and the cap layer 34 are preferably made of non-conductive dielectric materials, such as silicon nitride, silicon oxide or silicon oxynitride, but not limited thereto. Since the components depicted in FIG. 6 are almost similar to those depicted in FIG. 2, the detailed description of these components is therefore omitted for the sake of clarity.

One example of the DRAM cell is disclosed in the above first preferred embodiment. In this configuration, the halogen-doped dielectric layer 26 is disposed at the entire interface between the gate electrode 32 and the semiconductor substrate 10 so as to amend possible current leakage paths. It should be noted that the halogen-doped dielectric layer 26 is not restricted to single layer, it may also be a multiple layer. For example, after forming the single-layered halogen-doped dielectric layer, an optional single-layered or multi-layered non-halogen doped dielectric layer or halogen-doped dielectric layer may be further formed on the original halogen-doped dielectric layer, but not limited thereto.

In the following paragraph, various embodiments about backlight modules are disclosed and the description below is mainly focused on the differences between each embodiment. In addition, like or similar features will usually be described with similar reference numerals for the ease of illustration and description thereof.

Figure 7:
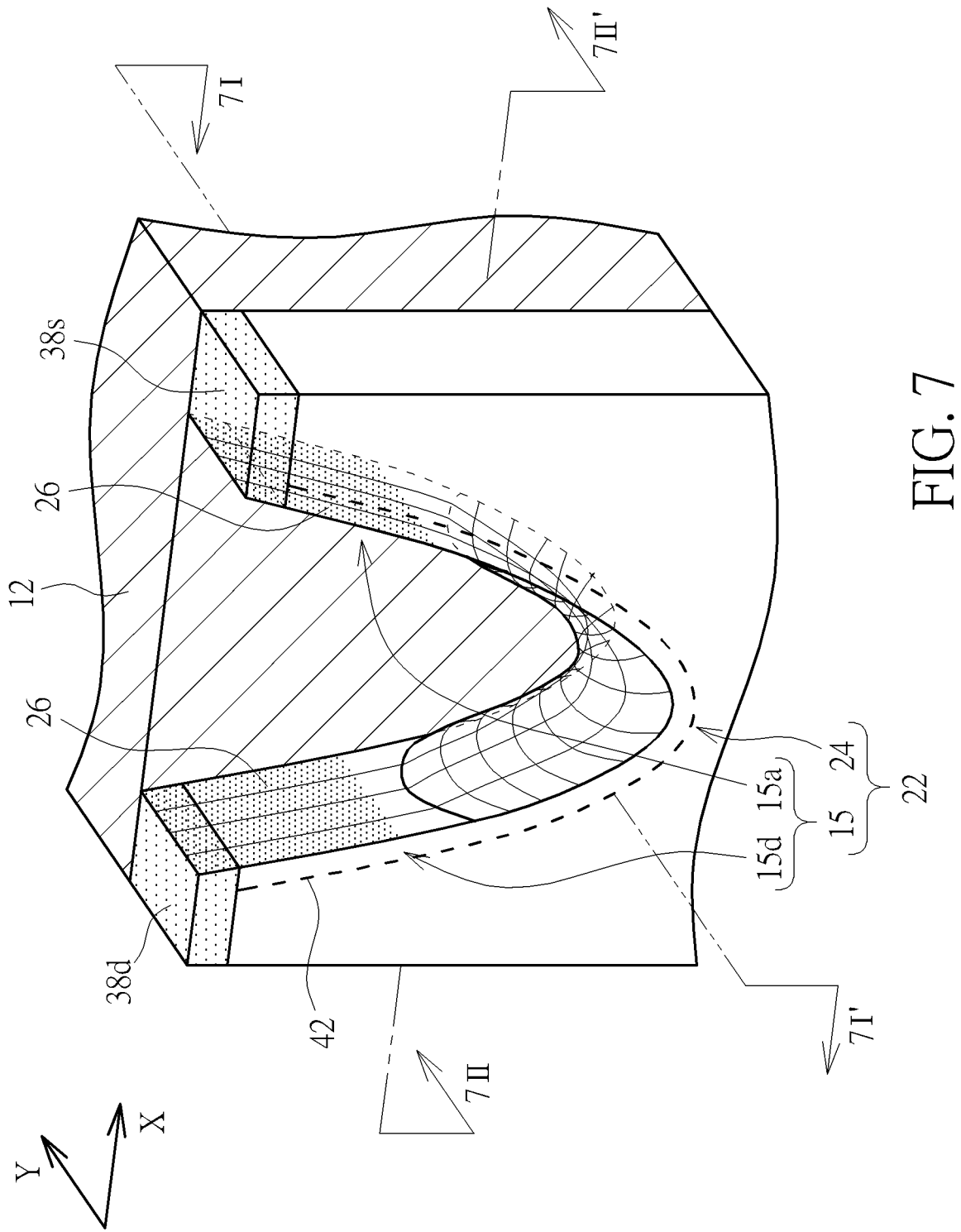
FIG. 7 is a schematic perspective diagram showing a memory cell with a recessed gate according to a second embodiment of the present invention.

Please refer to FIG. 7. FIG. 7 is a schematic perspective diagram showing a memory cell with a recessed gate according to a second embodiment of the present invention, wherein the I-I' diagram and the II-II' diagram in FIG. 7 respectively correspond to the I-I' diagram and the II-II' diagram in FIG. 1. The structure shown in FIG. 7 is similar to that shown in FIG. 3. As shown in FIG. 2, FIG. 3 and FIG. 7, the gate trench 22 also includes the sidewall portions 15 and the curved-bottom surface 24, and the halogen-doped dielectric layer 26 is disposed between the gate electrode 32 and the semiconductor substrate 10 as well. One main difference between these two embodiments is that the halogen-doped dielectric layer 26 disclosed in this embodiment mainly formed on the first sidewall 15a and the second sidewall 15b, while the gate dielectric layer on the curved-bottom surface 24 is still a non-halogen doped dielectric layer. To obtain this structure, a tilt ion implantation process may be carried out. For example, after the formation of the gate dielectric layer, the tilt ion implantation process is carried out so as to implant halogen atoms into the gate dielectric layer on the first sidewall 15a and the second sidewall 15b, but not limited thereto. Since other fabrication processes and components are all similar to those described in the first preferred embodiment, these similar fabrication processes and components are therefore not disclosed in detail for the sake of brevity.

Figure 8:
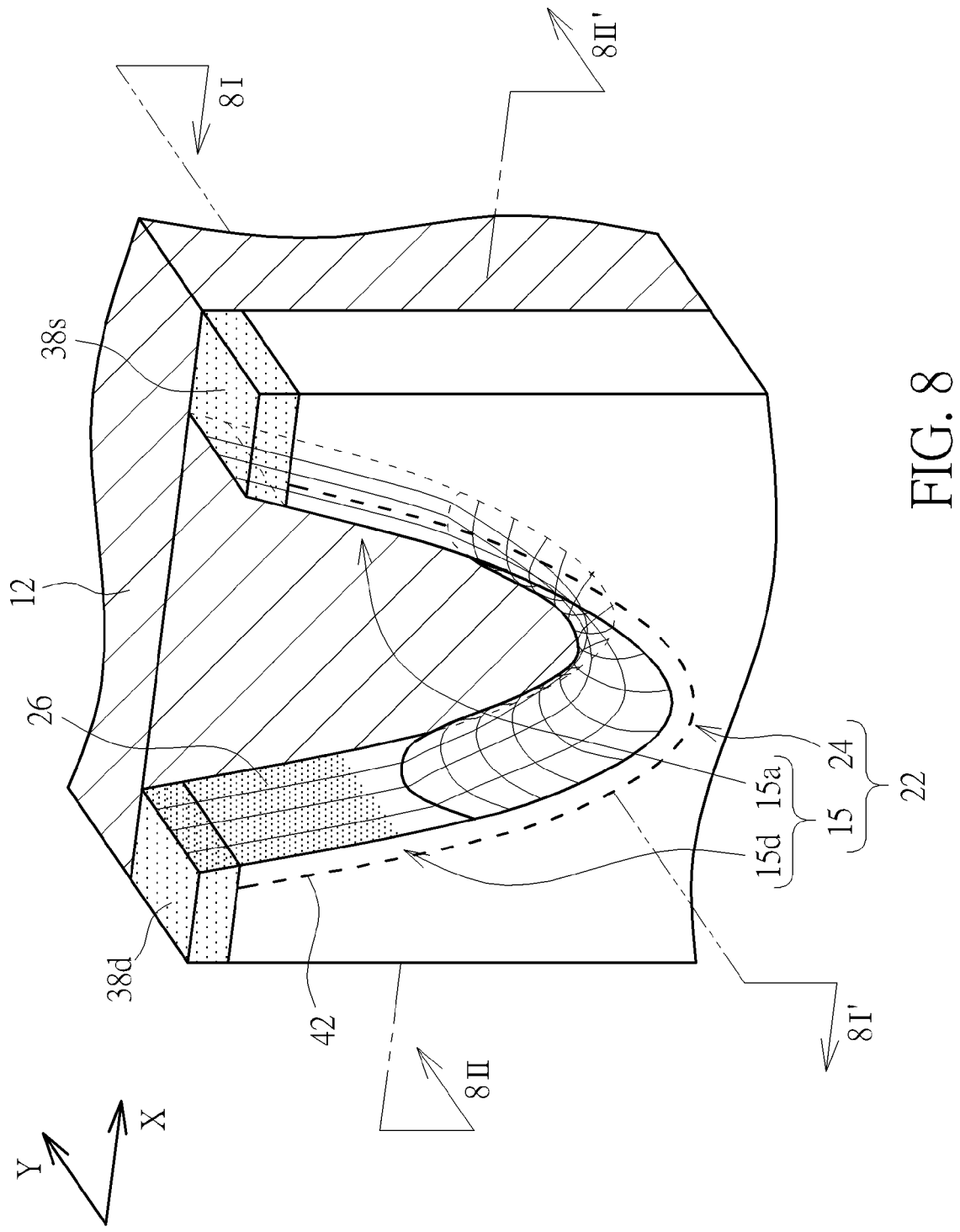
FIG. 8 is a schematic perspective diagram showing a memory cell with a recessed gate according to a third embodiment of the present invention.

Please refer to FIG. 8. FIG. 8 is a schematic diagram showing a memory cell with a recessed gate according to the third embodiment of the present invention, wherein the I-I' diagram and the II-II' diagram in FIG. 8 respectively correspond to the I-I' diagram and the II-II' diagram in FIG. 1. The structure shown in FIG. 8 is similar to that shown in FIG. 3. As shown in FIG. 2, FIG. 3 and FIG. 8, the gate trench 22 also includes the sidewall portions 15 and the curved-bottom surface 24, and the halogen-doped dielectric layer 26 is disposed between the gate electrode 32 and the semiconductor substrate 10 as well. One main difference between these two embodiments is that the halogen-doped dielectric layer 26 disclosed in this embodiment is mainly formed on the surface of the first sidewall 15a, while the gate dielectric layer on the second sidewall 15b and the curved-bottom surface 24 is still a non-halogen doped dielectric layer. To obtain this structure, a tilt ion implantation process may be carried out. For example, after the formation of the gate dielectric layer, the tilt ion implantation process is carried out so as to implant halogen atoms into the gate dielectric layer on the first sidewall 15a, but not limited thereto. Since the first sidewall 15a is adjacent to the drain region 38d, through implanting halogen atoms into the gate dielectric layer on the first sidewall 15a, the dangling bonds near the drain region 38d can be amended effectively and a data retention time can be increased as well. Since other fabrication processes and components are all similar to those described in the first preferred embodiment, these similar fabrication processes and components are therefore not disclosed in detail for the sake of brevity.

Figure 9:
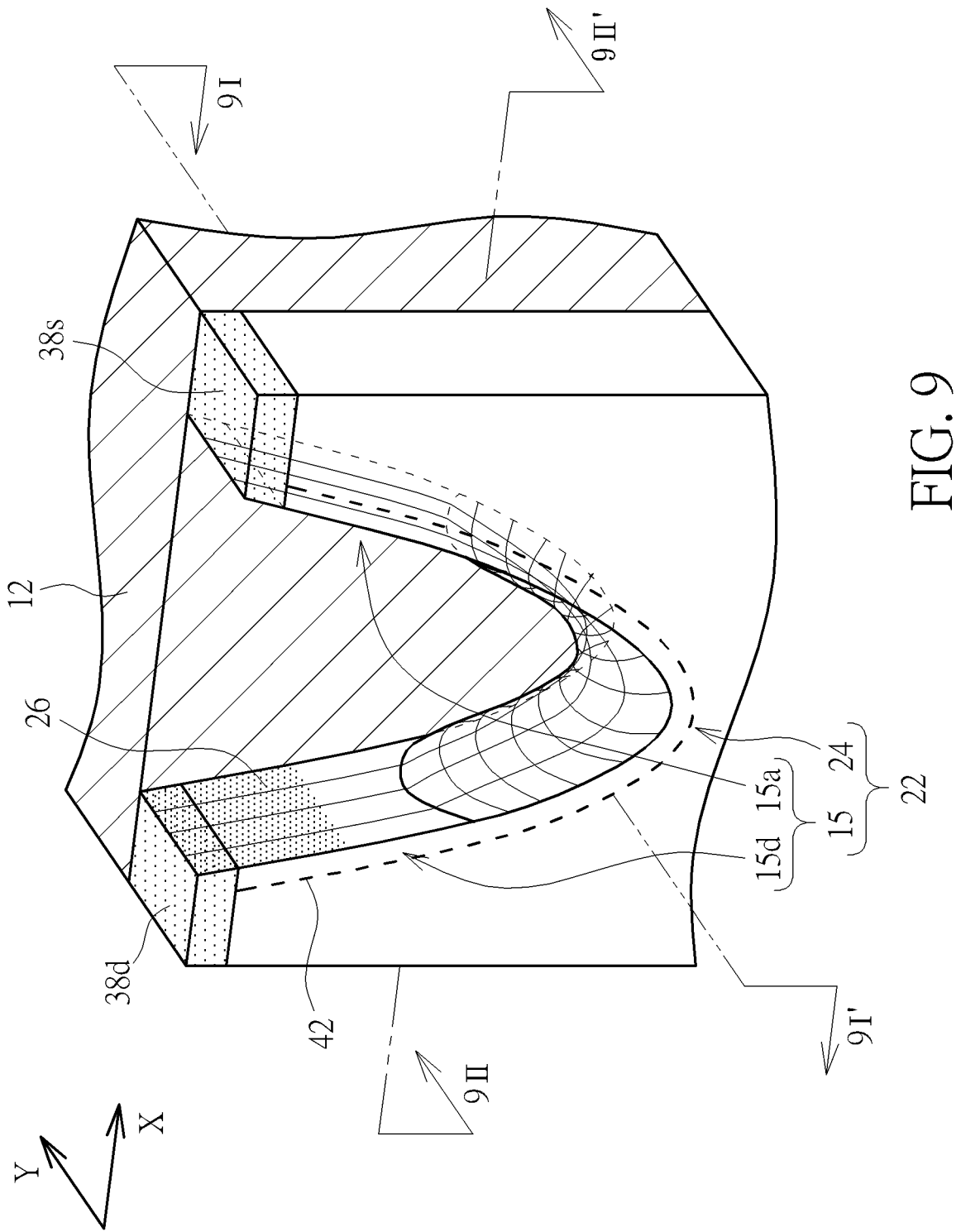
FIG. 9 is a schematic perspective diagram showing a memory cell with a recessed gate according to a fourth embodiment of the present invention.

Please refer to FIG. 9. FIG. 9 is a schematic perspective diagram showing a memory cell with a recessed gate according to the fourth embodiment of the present invention, wherein the I-I' diagram and the II-II' diagram in FIG. 9 respectively correspond to the I-I' diagram and the II-II' diagram in FIG. 1. The structure shown in FIG. 9 is similar to that shown in FIG. 3. As shown in FIG. 2, FIG. 3 and FIG. 9, the gate trench 22 also includes the sidewall portions 15 and the curved-bottom surface 24, and the halogen-doped dielectric layer 26 is disposed between the gate electrode 32 and the semiconductor substrate 10 as well. One main difference between these two embodiments is that the halogen-doped dielectric layer 26 disclosed in this embodiment is mainly formed on the upper surface of the first sidewall 15a, while the gate dielectric layer on the lower surface of the first sidewall 15a, on the second sidewall 15b and on the curved-bottom surface 24 is still a non-halogen doped dielectric layer. To obtain this structure, a tilt ion implantation process may be carried out. For example, after the formation of the gate dielectric layer, a large angle tilt ion implantation process is carried out along a single direction so as to implant halogen atoms into the gate dielectric layer on the upper surface of the first sidewall 15a, but not limited thereto. Similarly, since the upper surface of the first sidewall 15a is adjacent to the drain region 38d, through implanting halogen atoms into the gate dielectric layer on the upper surface of the first sidewall 15a, the dangling bonds near the drain region 38d can be amended effectively and a data retention time can be increased as well. Since other fabrication processes and components are all similar to those described in the first preferred embodiment, these similar fabrication processes and components are therefore not disclosed in detail for the sake of brevity.

Figure 10:
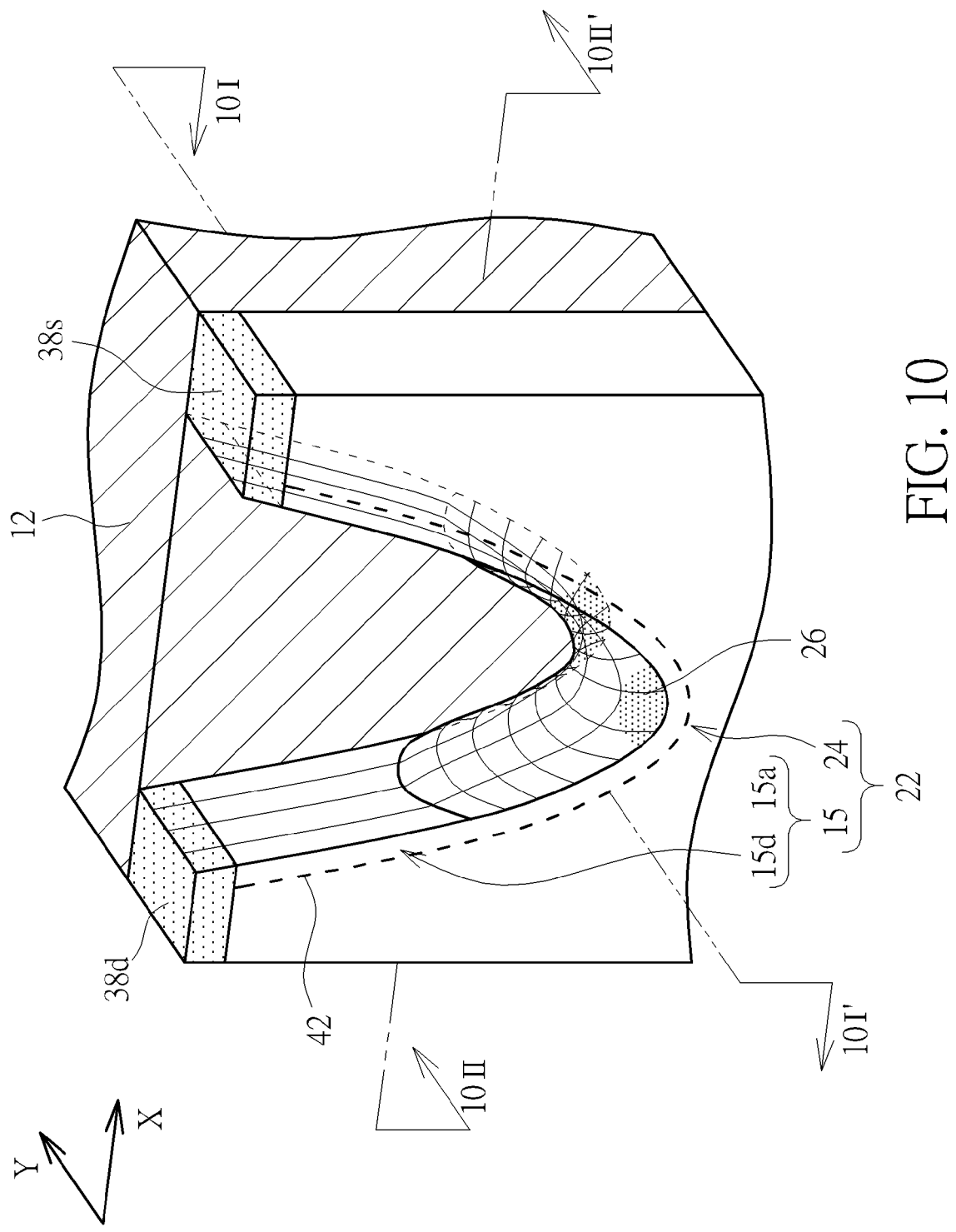
FIG. 10 is a schematic perspective diagram showing a memory cell with a recessed gate according to a fifth embodiment of the present invention.

Please refer to FIG. 10. FIG. 10 is a schematic perspective diagram showing a memory cell with a recessed gate according to the fifth embodiment of the present invention, wherein the I-I' diagram and the II-II' diagram in FIG. 10 respectively correspond to the I-I' diagram and the II-II' diagram in FIG. 1. The structure shown in FIG. 10 is similar to that shown in FIG. 3. As shown in FIG. 2, FIG. 3 and FIG. 10, the gate trench 22 also includes the sidewall portions 15 and the curved-bottom surface 24, and the halogen-doped dielectric layer 26 is disposed between the gate electrode 32 and the semiconductor substrate 10 as well. One main difference between these two embodiments is that the halogen-doped dielectric layer 26 disclosed in this embodiment is mainly formed on two sides of the curved-bottom surface 24 along a second direction Y, while the gate dielectric layer on the first sidewall 15a, second sidewall 15b and at the center region of the curved-bottom surface 24 is still a non-halogen doped dielectric layer. Since other fabrication processes and components are all similar to those described in the first preferred embodiment, these similar fabrication processes and components are therefore not disclosed in detail for the sake of brevity.

It should be noted that the position of the halogen-doped dielectric layer could be modified according to the previous first to five preferred embodiments. For example, the halogen-doped dielectric layer may be formed on upper surfaces of both the first sidewall and the second sidewall in order to achieve a superior data retention time. For the sake of clarity, the detailed description of which is therefore omitted.

To summarize, the present invention provides a memory cell with a recessed gate and a fabrication method thereof. Through performing a halogen implantation process, a halogen-doped dielectric layer with less dangling bonds can be formed and possible current leakage paths can be reduced. In this way, drawbacks, such as GIDL, are avoided and a data retention time is therefore enhanced. As a result, the performances and reliability of the corresponding DRAM devices are enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell with a recessed gate, comprising:
   a semiconductor substrate;
   a shallow trench isolation, disposed in the semiconductor substrate so as to define an active region;
   a source region, disposed on a side of the active region;
   a drain region, disposed on another side of the active region, wherein a direction from the source region to the drain region is defined as a first direction;
   a gate trench, disposed in the semiconductor substrate between the source region and the drain region, wherein the gate trench comprises a sidewall portion and a curved-bottom surface, and the curved-bottom surface has a convex profile when viewed from a cross-sectional view taken along a second direction orthogonal to the first direction;

a gate electrode, disposed in the gate trench;

a halogen-doped dielectric layer, disposed between the gate electrode and the semiconductor substrate, wherein the halogen-doped dielectric layer is situated directly on the curved-bottom surface; and at least a capacitor, electrically connected to the drain region.

2. The memory cell according to claim 1, wherein the curved-bottom surface substantially has a three-dimensional saddle-shaped profile.

3. The memory cell according to claim 1, wherein the sidewall portions comprise a first sidewall contiguous to the source region and a second sidewall contiguous to the drain region, and the first sidewall is opposite to the second sidewall along the first direction.

4. The memory cell according to claim 3, wherein the halogen-doped dielectric layer is disposed on surfaces of the first sidewall, the second sidewall, and the curved-bottom surface.

5. The memory cell according to claim 3, wherein the halogen-doped dielectric layer is disposed on a surface of the first sidewall.

6. The memory cell according to claim 3, wherein the halogen-doped dielectric layer is disposed on an upper surface of the first sidewall.

7. The memory cell according to claim 1, wherein the halogen-doped dielectric layer is a fluorine-containing dielectric layer and a concentration of fluorine atoms in the fluorine-containing dielectric layer substantially ranges from 1E11 atoms/cm$^3$ to 1E16 atoms/cm$^3$.

8. The memory cell according to claim 1, wherein the halogen-doped dielectric layer comprises halogen atoms.

9. The memory cell according to claim 1, wherein the halogen-doped dielectric layer comprises silicon oxide, silicon oxynitride, or high-k dielectric.

10. The memory cell according to claim 1, wherein the capacitor comprises stack capacitor or trench capacitor.

11. A method for fabricating a memory cell with a recessed gate, comprising:

providing a semiconductor substrate;

forming a shallow trench isolation in the semiconductor substrate so as to define an active region;

forming a source region on a side of the active region;

forming a drain region on another side of the active region, wherein a direction from the source region to the drain region is defined as a first direction;

forming a gate trench in the semiconductor substrate between the source region and the drain region, wherein the gate trench comprises a sidewall portion and a curved-bottom surface, and the curved-bottom surface has a convex profile when viewed from a cross-sectional view taken along a second direction orthogonal to the first direction;

forming a gate dielectric layer in the gate trench;

after forming the gate dielectric layer, performing a halogen implantation process to implant halogen atoms into the gate dielectric layer thereby forming a halogen-doped dielectric layer on a surface of the gate trench;

filling a gate electrode into the gate trench, wherein the halogen-doped dielectric layer is disposed between the gate electrode and the semiconductor substrate; and forming at least a capacitor, wherein the capacitor electrically connects the drain region.

12. The method according to claim 11, wherein the curved-bottom surface substantially has a three-dimensional saddle-shaped profile.

13. The method according to claim 11, wherein the sidewall portions comprise a first sidewall contiguous to the source region and a second sidewall contiguous to the drain region, and the first sidewall is opposite to the second sidewall along the first direction.

14. The method according to claim 13, wherein the halogen-doped dielectric layer is disposed on surfaces of the first sidewall, the second sidewall, and the curved-bottom surface.

15. The method according to claim 13, wherein the halogen-doped dielectric layer is disposed on a surface of the first sidewall.

16. The method according to claim 13, wherein the halogen-doped dielectric layer is disposed on an upper surface of the first sidewall.

17. The method according to claim 11, wherein the halogen-doped dielectric layer is a fluorine-containing dielectric layer and a concentration of fluorine atoms in the fluorine-containing dielectric layer substantially ranges from 1E11 atoms/cm$^3$ to 1E16 atoms/cm$^3$.

18. The method according to claim 11, wherein the halogen-doped dielectric layer is formed prior to forming the drain region and the source region.

19. The method according to claim 11, wherein the halogen implantation process comprises a fluorine ion implantation process.

* * * * *